(12) United States Patent
Ioka et al.

(10) Patent No.: US 6,479,374 B1
(45) Date of Patent: Nov. 12, 2002

(54) METHOD OF MANUFACTURING INTERCONNECTION STRUCTURAL BODY

(75) Inventors: Takaaki Ioka, Fuji (JP); Tsuneaki Tanabe, Fuji (JP); Ichiro Doi, Sunto-gun (JP)

(73) Assignee: Asahi Kasei Kabushiki Kaisha (JP)

( * ) Notice: Subject to any disclaimer, the term of this patent is extended or adjusted under 35 U.S.C. 154(b) by 0 days.

(21) Appl. No.: 09/647,310

(22) PCT Filed: Apr. 1, 1999

(86) PCT No.: PCT/JP99/01732

§ 371 (c)(1),
(2), (4) Date: Sep. 27, 2000

(87) PCT Pub. No.: WO99/52136

PCT Pub. Date: Oct. 14, 1999

(30) Foreign Application Priority Data

Apr. 1, 1998 (JP) .......................................... 10-088699

(51) Int. Cl.⁷ .............................................. H01L 21/44
(52) U.S. Cl. ...................... 438/601; 438/624; 438/637; 438/594; 438/476; 438/786
(58) Field of Search ................................ 438/601, 624, 438/637, 594, 737, 146, 638, 303, 421, 476, 786

(56) References Cited

U.S. PATENT DOCUMENTS

| 5,472,913 A | 12/1995 | Havemann et al. ......... 437/195 |
| 5,598,026 A * | 1/1997 | Kapoor et al. ............. 257/634 |

FOREIGN PATENT DOCUMENTS

| EP | 0 703 610 A1 | 3/1996 | ......... H01L/21/768 |
| JP | 62-102543 | 5/1987 | ........... H01L/21/88 |
| JP | 8-64680 | 3/1996 | ......... H01L/21/768 |
| JP | 8-162450 | 6/1996 | ......... H01L/21/316 |
| JP | 8-245278 A | 9/1996 | .......... C04B/38/00 |
| JP | 8-330300 A | 12/1996 | ......... H01L/21/316 |
| JP | 9-298241 A | 11/1997 | ......... H01L/21/768 |
| JP | 10158011 A * | 6/1998 | ........... C01B/33/12 |
| JP | 10158012 A * | 6/1998 | ........... C01B/33/12 |
| JP | 10-233446 | 9/1998 | ......... H01L/21/768 |

OTHER PUBLICATIONS

D. Edelstein et al., "Full Copper Wiring In A Sub–0.25 μm CMOS ULSI Technology", Internatonal Electron Device Meeting Technical Digest, 1997, pp. 773–776.

T. Saegusa, "Organic Polymer–Silica Gel Hybrid: A Precursor Of Highly Porous Silica Gel", J. Macromol. Sci.–Chem., 1991, vol. A28, No. 9, pp. 817–829.

T. Saegusa and Y. Chuko, "An Organic/Inorganic Hybrid Polymer", J. Macromol. Sci.–Chem., 1990, vol. A27, Nos. 13 & 14, pp. 1603–1612.

* cited by examiner

Primary Examiner—Matthew Smith
Assistant Examiner—Igwe U. Anya
(74) Attorney, Agent, or Firm—Pennie & Edmonds LLP

(57) ABSTRACT

Disclosed is a method for producing a circuit structure having an insulator layer comprising a porous silicon oxide thin film, which comprises (1) forming a preliminary insulator layer comprising a silicon oxide-organic polymer composite thin film formed on a substrate, which silicon oxide-organic polymer composite thin film comprises a silicon oxide having an organic polymer dispersed therein, (2) forming, in the preliminary insulator layer, a groove which defines a pattern for a circuit, (3) forming, in the groove, a metal layer which functions as a circuit, and (4) removing the organic polymer from the preliminary insulator layer to render the preliminary insulator layer porous, thereby converting the preliminary insulator layer to an insulator layer comprising a porous silicon oxide thin film. By the method of the present invention, the capacitance between mutually adjacent circuit lines (line-to-line capacitance) in the circuit structure can be lowered.

7 Claims, 2 Drawing Sheets

METHOD OF MANUFACTURING INTERCONNECTION STRUCTURAL BODY

BACKGROUND OF THE INVENTION

1. Field of the Invention

The present invention relates to a method for producing a circuit structure. More particularly, the present invention is concerned with a method for producing a circuit structure having an insulator layer comprising a porous silicon oxide thin film, which comprises (1) forming a preliminary insulator layer comprising a silicon oxide-organic polymer composite thin film formed on a substrate, which silicon oxide-organic polymer composite thin film comprises a silicon oxide having an organic polymer dispersed therein, (2) forming, in the preliminary insulator layer, a groove which defines a pattern for a circuit, (3) forming, in the groove, a metal layer which functions as a circuit, and (4) removing the organic polymer from the preliminary insulator layer to render the preliminary insulator layer porous, thereby converting the preliminary insulator layer to an insulator layer comprising a porous silicon oxide thin film. By the method of the present invention, not only can the line-to-line capacitance in the circuit structure be lowered, but also a low resistance metal, such as copper or silver, can be used as a material for a circuit, so that it has become possible to produce an excellent circuit structure in which the delay in the transmission of the electric signal (this phenomenon is the so-called "interconnect delay") is greatly suppressed, as compared to the case of the conventional circuit structures. Further, by the method of the present invention, it has become possible to produce such an excellent circuit structure with high efficiency.

The present invention is also concerned with a multilayer circuit board comprising the above-mentioned excellent circuit structure, and a semiconductor device comprising the above-mentioned excellent circuit structure.

2. Prior Art

Conventionally, as a material for an insulator layer used in a multilayer circuit of a semiconductor device, such as an LSI, a non-porous silicon oxide or a silicon oxide having incorporated therein a fluorine atom or an organic group has been used. However, the dielectric constants of such materials are high. In recent years, the density of the circuit in a semiconductor device, such as an LSI, has been increasing and, hence, the distance between the adjacent conductive paths of the circuit has been decreasing. Due to the decreased distance between the adjacent conductive paths of the circuit, the adjacent conductive paths function as a capacitor. In this case, when the dielectric constant of the insulator layer is high, a problem arises that the capacitance in the circuit becomes large, thereby leading to the delay in the transmittance of the electric signal through the circuit (i.e., interconnect delay). Therefore, in order to lower the dielectric constant of the insulator layer, it is attempted to use an insulator layer composed of a composite of a silicon oxide and an organic polymer, or a porous silicon oxide, i.e., a composite of a silicon oxide and air which has a dielectric constant of approximately 1.

In the future, when the density of the circuit of a semiconductor device, such as an LSI, has further increased, the importance of the alleviation of the interconnect delay would become much greater than that at present. Therefore, in addition to the lowering of the dielectric constant of the insulator layer, it also becomes necessary to use, as a material for a circuit, a low resistance metal represented by copper and silver instead of the conventionally used aluminum. However, in the conventional process for producing a circuit structure, it is difficult to use such a low resistance metal as a material for a circuit. The reason is as follows. The conventional process comprises: forming a metal layer on the entire surface of a substrate; forming, on the metal layer, a photoresist pattern (protective layer), which corresponds to the desired circuit pattern; removing the non-protected portions of the metal layer (i.e., the portions of the metal layer which are not covered by the photoresist pattern) by the conventional etching process, thereby forming a circuit on the substrate; and coating the circuit with an insulator layer. The above-mentioned conventional etching process utilizes a substance which is capable of forming a high vapor pressure compound with the metal used for forming the circuit. In such a conventional etching process, the protected portions of the metal layer, which are covered by the photoresist, are not eroded, and only the non-protected portions of the metal layer are converted into a high vapor pressure substance, so that the non-protected portions of the metal layer are selectively removed. However, when the metal layer is formed from a low resistance metal represented by copper and silver, such a low resistance metal cannot form a high vapor pressure compound, but forms only a low vapor pressure compound, so that the circuit cannot be formed by the conventional etching process. Therefore, in the conventional techniques, the above-mentioned low resistance metal cannot be used as a material for forming a circuit.

In order to solve the above-mentioned problems, the so-called "damascene process" has been proposed. The damascene process comprises: forming an insulator layer on a substrate; forming, in the insulator layer, a groove which defines a pattern for a circuit; forming a layer of a metal on the entire surface of the insulator layer, so that the groove is completely filled with the metal; removing the metal which is not present in the groove by etch back method utilizing a plasma or chemical mechanical polishing (CMP) method, so that the surfaces of the insulator layer and the surface of the metal layer (which functions as a circuit) are exposed (with respect to the damascene method, reference can be made to, for example, "International Electron Device Meeting Technical Digest" (1997), p. 773–776, and Unexamined Japanese Patent Application Laid-Open Specification No. 62-102543). Thus, in the damascene process, the formation of the circuit need not be conducted by the conventional etching method, but can be conducted by etch back method utilizing a plasma or chemical mechanical polishing (CMP) method. Therefore, in the damascene process, a low resistance metal, such as copper or silver, can be used as a material for the circuit.

Further, as well known in the art, when the damascene process is employed for the production of a multilayer circuit board comprising a laminate of a plurality of circuit structures, the number of steps required for the production is small, as compared to that in the conventional process. Therefore, the damascene process is very advantageous for reducing the production cost.

Specifically, in the production of a multilayer circuit board by a conventional method, the formation of a new (upper) circuit structure on a (lower) circuit structure which has been already formed is conducted by a process comprising the steps of: forming, on the lower circuit structure, an insulator layer for separating the lower circuit structure from the upper circuit structure to be formed; forming, in the insulator layer, a vertical through-hole for accommodating therein a vertical conductive path which electrically connects the lower circuit structure and the upper circuit structure to be formed; forming a vertical conductive path in the through-hole; and forming the upper circuit structure in the same manner as mentioned above in connection with the conventional process for producing a circuit structure.

By contrast, in the damascene process, after an insulator layer for separating the lower circuit structure from the upper circuit structure (to be formed) is formed on the lower circuit structure, the formation of the vertical through-hole for accommodating therein a vertical conductive path (which electrically connects the lower circuit structure and the upper circuit structure to be formed) and the formation (in the insulator layer separating the lower circuit structure from the upper circuit structure) of the groove which defines a pattern for a circuit of the upper circuit structure can be conducted in a single step. Then, the above-mentioned vertical through-hole and the above-mentioned groove can be simultaneously filled with the metal. After the vertical through-hole and the groove are filled with the metal, the upper circuit structure can be completed by only removing the metal which is not present in the groove by the above-mentioned etch back method utilizing a plasma or the above-mentioned chemical mechanical polishing (CMP) method. Thus, the damascene process is very advantageous not only in that a low resistance metal, such as copper or silver, can be used, but also in that the number of steps required for the production of a multilayer circuit board is small, as compared to that in the conventional process.

However, the conventional damascene process has the following problem. The insulator layer used in the conventional damascene process is composed of a silicon oxide and is produced by plasma chemical vapor deposition (CVD). This silicon oxide insulator layer has a high dielectric constant and, hence, the interconnect delay cannot be satisfactorily suppressed. In order to solve this problem, it has been proposed to employ an insulator layer having a dielectric constant lower than that of the above-mentioned silicon oxide insulator layer produced by plasma CVD.

For example, it is known to use an insulator layer composed of a composite of a silicon oxide and an organic polymer. With respect to the above-mentioned organic polymer used in such an insulator layer, the organic polymer needs to have a low dielectric constant so as to obtain an insulator layer having a satisfactorily low dielectric constant. Examples of such organic polymers include paraquinoxaline (dielectric constant: 2.70) reported by Hedrick et al (Polymer, Vol. 34, p. 4717 (1993)) and polyquinoline (dielectric constant: 2.5) reported by Monk et al (Polymers for Dielectric and Photonic Applications, p. 119, (1993)).

However, the above-mentioned silicon oxide-organic polymer composite cannot be used for producing an insulator layer having a satisfactorily low dielectric constant.

In this situation, a technique employing a porous silicon oxide film as the insulator layer has been drawing attention. In this technique, the dielectric constant of a silicon oxide film is lowered by rendering the silicon oxide film porous to thereby obtain a composite of the silicon oxide and air. This technique is described in, for example, U.S. Pat. No. 5,472,913. Specifically, with respect to the insulator layer, this patent document describes the use of a porous silicon oxide film produced by a method comprising: subjecting a tetralkoxysilane to hydrolysis and dehydration condensation in an alcohol to form a wet silicon oxide gel film; and immersing the formed wet silicon oxide gel film in a solution of trimethylchlorosilane (which is a silylation agent) to thereby render water repellent the surface of the wet silicon oxide gel film, followed by drying under atmospheric pressure. However, it has conventionally been very difficult to produce a circuit structure having a insulator layer composed of a porous silicon oxide by the damascene process, for the following reason.

In the above-mentioned U.S. Pat. No. 5,472,913, the porous silicon oxide film obtained by the above-mentioned method is covered with a protective layer composed of a non-porous silicon oxide. Then, the protective layer is etched by lithography method, followed by the formation of the above-mentioned vertical through-hole by etching the porous silicon oxide film (insulator layer) under conditions different from those employed in the etching of the protective layer. However, even when the thickness of the protective layer composed of the non-porous silicon oxide is only slightly uneven, the porous silicon oxide (positioned below the protective layer) is caused to be unevenly etched at a speed several times higher than that in the case of the etching of the protective layer. Therefore, the thickness of the protective layer and the etching conditions must be strictly controlled, thereby causing a great difficulty.

Thus, generally, when it is attempted to process finely the porous silicon oxide film so as to form a circuit on the porous silicon oxide film, a great difficulty is encountered due to the poor resistance of the porous silicon oxide against the dry etching and the like.

Further, the damascene process has the following problem. In the damascene process, a metal layer is formed on the insulator layer having a fine groove which defines the pattern for a circuit. Therefore, when the porous silicon oxide film is used as the insulator layer, there is a danger that the metal intrudes into the pores of the insulator layer during the formation of the metal layer. This problem also renders difficult the use of the porous silicon oxide film in the damascene process.

Further, in the damascene process, it is necessary to employ an etch back method or a chemical mechanical polishing (CMP) method for removing the metal which is not present in the groove or removing a part of the insulator layer (for forming a vertical through-hole). However, when the porous silicon oxide film is used as the insulator layer, disadvantages are likely to be caused during the etch back or the CMP. Specifically, in the case of the etch back method utilizing a plasma, when the porous silicon oxide is exposed to the plasma, the gas generated during the etching is trapped in the pores of the insulator layer, or the insulator layer is damaged. Further, in the case of the CMP, since an acidic or alkaline aqueous slurry containing abrasive particles is used, there is a danger that the insulator layer is dissolved or damaged.

In order to solve the above-mentioned problems, Zielinski et al propose a method in which, prior to the formation of the metal layer and the subsequent CMP, the porous silicon oxide film having a groove (which defines the pattern for a circuit) is covered with a protective layer composed of a non-porous silicon oxide film (International Electron Device Meeting Technical Digest (1997) p. 936–938). In this method, the abrasion of the porous silicon oxide film can be prevented by the protective layer. Therefore, this method is free from the above-mentioned problem of the damage to the porous silicon oxide film. Further, since the side walls of the groove are also protected by the nonporous silicon oxide film, the danger of the intrusion of the metal into the pores of the insulator layer can be alleviated.

However, this method has a problem that the step of formation of the protective layer is necessary, so that the process for forming the circuit structure becomes cumbersome. In addition, this method has a problem that the non-porous silicon oxide film (having a high dielectric constant) remains on a part of the surface of the insulator layer and the side walls of the groove, so that, despite that the porous silicon oxide film is used as the insulator layer, a satisfactorily low dielectric constant cannot be achieved.

SUMMARY OF THE INVENTION

In this situation, the present inventors have made extensive and intensive studies toward solving the above-mentioned problems accompanying the prior art and developing a method for efficiently producing a circuit structure having an insulator layer comprising a porous silicon oxide film which has a high dielectric constant by the commercially advantageous damascene process. As a result, it has unexpectedly been found that this object can be attained by a method comprising: (1) forming a preliminary insulator layer comprising a silicon oxide-organic polymer composite thin film formed on a substrate, which silicon oxide-organic polymer composite thin film comprises a silicon oxide having an organic polymer dispersed therein, (2) forming, in the preliminary insulator layer, a groove which defines a pattern for a circuit, (3) forming, in the groove, a metal layer which functions as a circuit, and (4) removing the organic polymer from the preliminary insulator layer to render the preliminary insulator layer porous, thereby converting the preliminary insulator layer to an insulator layer comprising a porous silicon oxide thin film. The present invention has been completed, based on this novel finding.

Accordingly, it is a primary object of the present invention to provide a method based on the damascene process, which can be used for easily and efficiently producing a circuit structure in which the capacitance between the adjacent conductive paths of the circuit (i.e., line-to-line capacitance) is small, so that the delay in the transmittance of the electric signal through the circuit (i.e., interconnect delay) is small, wherein the damascene process is commercially advantageous not only in that a low resistance metal, such as copper or silver, can be used as a material for a circuit, but also in that this process is suitable for the production of a multilayer circuit board.

Another object of the present invention is to provide a multilayer circuit board and a semiconductor device, each comprising the above-mentioned excellent circuit structure.

The foregoing and other objects, features and advantages of the present invention will be apparent from the following detailed description and claims taken in connection with the accompanying drawings.

DETAILED DESCRIPTION OF THE INVENTION

Figure 1:
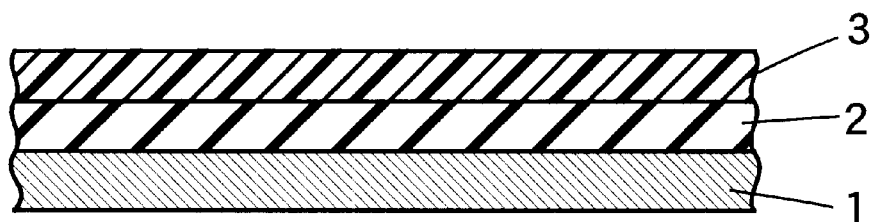
FIG. 1 is a cross-sectional view of a structure comprising a substrate having formed thereon a silicon oxide-organic polymer composite thin film, and a photoresist film formed on the surface of the composite thin film.

According to the present invention, there is provided a method for producing a circuit structure comprising:
(a) a substrate,
(b) an insulator layer formed on the substrate, the insulator layer comprising a porous silicon oxide thin film having a groove, the groove defining a pattern for a circuit, and
(c) a circuit comprising a metal layer formed in the groove,
the method comprising the steps of:
(1) forming a preliminary insulator layer comprising a silicon oxide-organic polymer composite thin film formed on the substrate, the silicon oxide-organic polymer composite thin film comprising a silicon oxide having an organic polymer dispersed therein,
(2) forming, in the preliminary insulator layer, a groove which defines a pattern for a circuit,
(3) forming, in the groove, a metal layer which functions as a circuit, and
(4) removing the organic polymer from the silicon oxide-organic polymer composite thin film of the preliminary insulator layer to render the preliminary insulator layer porous, thereby converting the preliminary insulator layer to an insulator layer comprising a porous silicon oxide thin film.

For easy understanding of the present invention, the essential features and various preferred embodiments of the present invention are enumerated below.
1. A method for producing a circuit structure comprising:
(a) a substrate,
(b) an insulator layer formed on the substrate, the insulator layer comprising a porous silicon oxide thin film having a groove, the groove defining a pattern for a circuit, and
(c) a circuit comprising a metal layer formed in the groove,
the method comprising the steps of:
(1) forming a preliminary insulator layer comprising a silicon oxide-organic polymer composite thin film formed on the substrate, the silicon oxide-organic polymer composite thin film comprising a silicon oxide having an organic polymer dispersed therein,
(2) forming, in the preliminary insulator layer, a groove which defines a pattern for a circuit,
(3) forming, in the groove, a metal layer which functions as a circuit, and
(4) removing the organic polymer from the silicon oxide-organic polymer composite thin film of the preliminary insulator layer to render the preliminary insulator layer porous, thereby converting the preliminary insulator layer to an insulator layer comprising a porous silicon oxide thin film.

2. The method according to item 1 above, wherein the removal of the organic polymer from the preliminary insulator layer is conducted by light irradiation-heat treatment.

3. The method according to item 1 or 2 above, wherein the organic polymer in the silicon oxide-organic polymer composite thin film comprises at least one polymer selected from the group consisting of a polymer having a graft structure and a polymer having a three-dimensional network structure.

4. A circuit structure produced by the method of any one of items 1 to 3 above.

5. A multilayer circuit board comprising a laminate of a plurality of circuit structures, wherein at least one circuit structure of the circuit structures is the circuit structure of item 4 above.

6. A semiconductor device comprising the circuit structure of item 4 above.

The present invention will now be described in detail.

The circuit structure obtained by the method of the present invention comprises: (a) a substrate, (b) an insulator layer formed on the substrate, which comprises a porous silicon oxide thin film having a groove defining a pattern for a circuit, and (c) a circuit comprising a metal layer formed in the groove.

In the method of the present invention for producing a circuit structure, first, a preliminary insulator layer is formed on a substrate. The preliminary insulator layer comprises a silicon oxide-organic polymer composite thin film comprising a silicon oxide having an organic polymer dispersed therein.

Examples of substrates include a substrate made of a semiconductor, such as silicon or germanium, a substrate made of a compound semiconductor, such as gallium-arsenic or indium-antimony, and a prepreg for the substrate of a printed circuit board. With respect to the thickness of the substrate, there is no particular limitation. For example, in the case of a semiconductor substrate, the thickness of the substrate is preferably 0.1 mm or more, more preferably from 0.3 to 1 mm. When the thickness of the semiconductor substrate is not more than 0.1 mm, there is a danger that the substrate is warped or distorted by the internal stress of the preliminary insulator layer or the insulator layer (comprising the porous silicon oxide thin film), which is formed on the substrate. If desired, prior to the formation of the preliminary insulator layer on the substrate, the substrate may be coated with a film of a substance, such as silicon dioxide, a silicon nitride, titanium nitride, tungsten nitride or the like.

Further, with respect to the substrate used in the present invention, the substrate may have formed thereon a device or a circuit structure (each produced using a conductive substance, a semiconductor, an insulating substance and the like by the method of the present invention and/or the conventional method).

With respect to the above-mentioned silicon oxide-organic polymer composite thin film which is formed on the substrate as a preliminary insulator layer, such a composite thin film is already known. For example, such a composite thin film can be produced by the method described in J. Macromol. Sci.-Chem., A28(9), pp.817–829 (1991). However, it is preferred to produce the silicon oxide-organic polymer composite thin film by a method comprising:

(1) applying onto a substrate a liquid mixture of (i) a silicon compound selected from the group consisting of an alkoxysilane, and a mixture of an alkoxysilane and a hydrolysis product thereof, and (ii) an organic material selected from the group consisting of an organic polymer having no polymerizable functional group, an organic polymer having at least one polymerizable functional group and a polymerizable organic monomer, wherein the liquid mixture may be a solution of the mixture of (i) and (ii) in a solvent described below, to thereby form a thin film of the mixture of the silicon compound and the organic material on the substrate, (2) subjecting the silicon compound in the thin film to hydrolysis and dehydration condensation under conditions wherein the gelation of the silicon compound satisfactorily proceed, to thereby gelate the silicon compound in the thin film, wherein, when the organic polymer of the mixture used for forming the thin film contains an organic polymer having at least one polymerizable functional group, a polymerizable organic monomer or a mixture thereof, the organic material present in the thin film is subjected to polymerization reaction before, simultaneously with or after the hydrolysis and dehydration condensation of the silicon compound, thereby forming on the substrate a silicon oxide-organic polymer composite thin film in which the particles of the organic polymer are dispersed in the silicon oxide.

However, the method for forming the silicon oxide-organic polymer thin film is not limited to the method exemplified above.

Hereinbelow, the above-mentioned method is explained.

It is preferred that the silicon compound used in the present invention is an alkoxysilane or a mixture of an alkoxysilane and a hydrolysis product thereof. When such a silicon compound is used, the above-mentioned thin film of the mixture of the silicon compound and the organic material can be converted into the preliminary insulator layer by treating the thin film of the mixture of the silicon compound and the organic material with water or steam. Specifically, when the thin film containing an alkoxysilane as the silicon compound is treated with water or steam, the alkoxy group of the alkoxysilane is converted to a hydroxyl group, thereby causing the dehydration condensation reaction of the silane, so that the gelation of the silicon compound occurs to thereby forming a preliminary insulator layer comprising the silicon oxide-organic polymer composite thin film having a structure in which the organic polymer is dispersed in the silicon oxide. When the mixture of the silicon compound and the organic material is a solution thereof in a solvent, it is preferred that the amount of the solvent is 0.05% by weight or more, based on the weight of the solution. The thickness of the silicon oxide-organic polymer composite thin film is preferably 0.1 to 10 $\mu$m, more preferably 0.2 to 3 $\mu$m. When the thickness of the silicon oxide-organic polymer composite thin film is more than 10 $\mu$m, unfavorable cracking may occur.

It is preferred that the organic polymer used in the present invention is an organic polymer having no polymerizable functional group, an organic polymer having at least one polymerizable functional group, a polymerizable organic monomer or a mixture thereof.

With respect to the organic polymer having no polymerizable functional group, there is no particular limitation. Preferred examples of organic polymers having no polymerizable functional group include polyethers, such as polyethylene glycol, polypropylene glycol and polytetramethylene glycol; amides, such as a polyacrylamide derivative, a polymethacrylamide derivative, poly(N-vinylpyrrolidone) and poly(N-acylethyleneimine); poly(vinyl alcohol); poly (vinyl acetate); esters, such as a poly(acrylic acid) derivative (e.g., poly(methyl acrylate) and poly(ethyl acrylate)), a poly(methacrylic acid) derivative (e.g., poly(methyl methacrylate) and poly(ethyl methacrylate)) and polycaprolactone; polyanhydride, such as poly(malonyl oxide), poly (adipoyl oxide), poly(pimeloyl oxide), poly(suberoyl oxide), poly(azelaoyl oxide) and poly(sebacoyl oxide); polymides; polyurethanes; polyureas; and polycarbonates. Further, as the organic polymer having no polymerizable functional group, various copolymer can be also used. Examples of copolymers include a copolymer of the monomers used for producing the above-mentioned polymers, such as an ethylene glycol/propylene glycol copolymer, an acrylamide/ acrylic acid copolymer or a vinyl alcohol/vinyl acetate copolymer; a copolymer of a monomer used in the production of the above-mentioned polymer and another monomer, such as an ethylene/acrylic acid copolymer or a vinyl chloride/vinyl acetate copolymer. With respect to the degree of polymerization of the organic polymer having no polymerizable functional group, it is generally in the range of from 8 to 350,000. As the organic polymer having no polymerizable functional group, it is preferred to use an organic polymer formed from an alipahtic compound, since, as described below, a preliminary insulator layer containing such an organic polymer can be easily converted into the insulator layer comprising a porous silicon oxide thin film. From this point of view, especially preferred are polyethers, such as polyethylene glycol, polypropylene glycol and polytetramethylene glycol.

Further, from the viewpoint of improving the mechanical strength of the silicon oxide-organic polymer composite thin film and suppressing the shrinkage of the composite thin film during the conversion thereof into the porous silicon oxide thin film, it is preferred that the organic polymer has at least one polymerizable functional group. In this case, the organic polymer forms a graft structure and/or a three-dimensional network structure in the silicon oxideorganic polymer composite thin film. Examples of polymerizable functional groups of the organic polymer include a vinyl group, a vinylidene group, a vinylene group, a glycidyl group, an allyl group, an acrylate group, a methacrylate group, an acrylamide group, a methacrylamide group, a carboxyl group, a hydroxyl group, an isocyanate group, an amino group, an imino group and a halogen. Each of these polymerizable functional groups may be present at the main chain, terminal or side chain of the polymer. Further, the functional groups may be bonded directly to the polymer or bonded to the polymer through a spacer, such as an alkylene group and an ether group. The organic polymer may have a single type of the functional group or at least two different types of the functional groups. Among the functional groups mentioned above, preferred are a vinyl group, a vinylidene group, a vinylene group, a glycidyl group, an allyl group, an acrylate group, a methacrylate group, an acrylamide group and a methacrylamide group.

Specific examples of preferred organic polymers having a polymerizable functional group include: an aliphatic polyether having at terminal(s) thereof a polymerizable functional group, such as an acrylate group, a methacrylate group, a vinyl group or a glycidyl group, which aliphatic polyether is represented by polyethylene glycol acrylate, polyethylene glycol diacrylate, polyethylene glycol methacrylate, polyethylene glycol dimethacrylate, polyethylene glycol alkyletheracrylate, polyethylene glycol alkylethermethacrylate, polyethylene glycol vinyl ether, polyethylene glycol divinyl ether, polyethylene glycol glycidyl ether, polyethylene glycol diglycidyl ether, polypropylene glycol acrylate, polypropylene glycol diacrylate, polypropylene glycol methacrylate, polypropylene glycol dimethacylate, polypropylene glycol alkyletheracrylate, polypropylene glycol alkylethermethacrylate, polypropylene glycol vinyl ether, polypropylene glycol divinyl ether, polypropylene glycol glycidyl ether, polypropylene glycol diglycidyl ether and the like; a poly(meth)acrylate having at the side chain thereof a polymerizable functional group, such as a vinyl group, a glycidyl group and a allyl group, which poly(meth)acrylate is represented by poly(glycidyl acrylate), poly(glycidyl methacrylate), poly(allyl acrylate), poly(allyl methacrylate), poly(vinyl acrylate), poly(vinyl methacrylate) and the like; poly(vinyl cinnamate); and an epoxy resin. Among these, from the viewpoint of easiness in conversion of the silicon oxide-organic polymer composite thin film into the porous silicon oxide thin film by the heat treatment described below, especially preferred are: polyethylene glycol acrylate, polyethylene glycol diacrylate, polyethylene glycol methacrylate, polyethylene glycol dimethacrylate, polyethylene glycol alkyletheracrylate, polyethylene glycol alkylethermethacrylate, polyethylene glycol vinyl ether, polyethylene glycol divinyl ether, polyethylene glycol glycidyl ether, polyethylene glycol diglycidyl ether, polypropylene glycol acrylate, polypropylene glycol diacrylate, polypropylene glycol methacrylate, polypropylene glycol dimethacrylate, polypropylene glycol alkyletheracrylate, polypropylene glycol alkylethermethacrylate, polypropylene glycol vinyl ether, polypropylene glycol divinyl ether, polypropylene glycol glycidyl ether and polypropylene glycol diglycidyl ether.

In the method of the present invention, when the organic polymer having a polymerizable functional group and/or the organic polymer having no polymerizable functional group is used as an organic material, the amount of the organic polymer used is generally $10^{-2}$ to 100 parts by weight, preferably $10^{-1}$ to 10 parts by weight, more preferably $10^{-1}$ to 5 parts by weight, per part by weight of the silicon compound. When the amount of the organic polymer used is less than $10^{-2}$ part by weight, it becomes likely that the porosity of the porous silicon oxide thin film becomes too small and, hence, a desired dielectric constant cannot be obtained. On the other hand, when the amount of the organic polymer used is more than 100 parts by weight, it becomes likely that the strength of the porous silicon oxide thin film becomes low and, hence, the thin film cannot be put into practical use.

In the method of the present invention, with respect to the polymerizable organic monomer used as an organic material, there is no particular limitation. When a bifunctional monomer is used, the resultant organic polymer forms a graft structure and/or a three-dimensional network structure in the silicon oxideorganic polymer composite thin film.

Preferred examples of polymerizable organic monomers include acrylic acid, methacrylic acid and derivatives thereof, such as an acrylate, a methacrylate, ethylene bisacrylate, ethylene bismethacrylate, acyanoacrylic acid and a-cyanoacrylate; acid vinyl esters, such as vinyl acetate, vinyl propionate, vinyl crotonate, vinyl benzoate and vinyl chloroformate; amides, such as acrylamide, methacrylamide, N,N'-dialkylacrylamide, N,N'-dialkylmethacrylamide, N-alkylacrylamide, N-alkylmethacrylamide, N,N'-methylenebisacrylamide, N-vinylpyrrolidone, N-vinylformamide and N-vinylacetamide; vinyl group-containing hydrocarbons, such as styrene, α-methylstyrene, p-methoxystyrene, diphenylethylene, vinylnaphthalene, vinylanthracene, vinylcyclopentane, vinylcyclohexane and 5-vinyl-2-norbornene; acrylonitrile, methacrylonitrile and derivatives thereof; vinyl amines, such as N-vinylpyridine, N-vinylcarbazole and N-vinylimidazole; vinylalkylethers; vinylalkylketones; glycidyl acrylate; glycidyl methacrylate; and an epoxy resin.

With respect to the above-mentioned organic materials (i.e., the organic polymers having no polymerizable functional group, the organic polymers having a polymerizable functional group or the polymerizable organic monomers), they can be used individually or in combination. Further, the organic polymer and the organic monomer can be used in combination.

When a polymerizable organic monomer is used, the amount of the polymerizable organic monomer is generally $10^{-2}$ to 100 parts by weight, preferably $10^{-1}$ to 10 parts by weight, more preferably $10^{-1}$ to 5 parts by weight, per part by weight of the silicon compound. When the above-mentioned organic polymer and the above-mentioned polymerizable monomer are used in combination, the total amount of the organic polymer and the polymerizable monomer is generally in the same range as mentioned above.

As mentioned above, when the thin film of the mixture of the silicon compound and the organic material contains the organic polymer having at least one polymerizable functional group, the polymerizable organic monomer or the mixture thereof, the organic material present in the thin film is subjected to polymerization reaction before, simultaneously with or after the hydrolysis and dehydration condensation of the silicon compound.

In the method of the present invention, when the organic polymer having a polymerizable functional group, the polymerizable organic monomer or the mixture thereof is used as the organic material, a polymerization initiator can be used for accelerating the polymerization reaction. As the polymerization initiator, a known polymerization initiator can be used. Examples of known polymerization initiators include thermal initiators, such as an azo compound and an organic peroxide; photoinitiators, such as a diazo compound, an azide and a derivative of acetophenone; a photo acid generator; and a photo alkali generator. These initiators can be used individually or in combination. The thermal polymerization and photopolymerization using the initiator can be performed by a known method. The amount of the initiator used is generally $10^{-3}$ part by weight, preferably $10^{-2}$ to $10^{-1}$ part by weight, per part by weight of the organic polymer having a polymerizable functional group and/or the polymerizable organic monomer.

Preferred examples of alkoxysilanes usable as the silicon compound in the method of the present invention include tetraalkoxysilanes, such as tetramethyoxysilane, tetraethoxysilane, tetra(n-propoxy)silane, tetra(i-propoxy)silane, tetra(n-butoxy)silane and tetra(t-butoxy)silane. Further examples of alkoxysilanes usable in the present invention include an oligomer of an alkoxysilane, such as the so-called "ethyl silicate" or "methyl silicate"; an alkoxysilane having bonded to the silicon atom thereof a hydrogen atom, an alkyl group or an aryl group, such as trimethoxysilane, triethoxysilane, methyltrimethoxysilane, methyltriethoxysilane, phenyltrimethoxysilane, phenyltriethoxysilane, bis(trimethoxysilyl)methane, bis(triethoxysilyl)methane, 1,2-bis(trimethoxysilyl)ethane, 1,2-bis(triethoxysilyl)ethane, 1,4-bis(trimethoxysilyl)benzene or 1,4-bis(triethoxysilyl)benzene; an alkoxysilane having the alkoxy group thereof replaced with a hydroxyl group; and a hydrolysis product of an alkoxysilane, in which the alkoxysilane is oligomerized. These alkoxysilanes can be used individually or in combination.

Further, from the viewpoint of controlling the properties of each of the preliminary insulator layer (comprising a silicon oxide-organic polymer composite thin film) and the porous silicon oxide thin film, a monoalkoxysilane or a dialkoxysilane, which has bonded to the silicon atom thereof 2 or 3 non-alkoxy substituents selected from the group consisting of a hydrogen atom, an alkyl group and an aryl group, can be used in combination with the alkoxysilanes mentioned above. The amount of the monoalkoxysilane and/or the dialkoxysilane is generally 80 mol % or less, based on the total molar amount of the silicon compounds. When the amount of the monoalkoxysilane and/or the dialkoxysilane exceeds 80 mol %, there is a danger that the gelation of the silicon compound does not occur.

In the method of the present invention, it is not necessary to dissolve the silicon compound/organic material mixture (used for forming the silicon oxideorganic polymer composite thin film) in a solvent. However, the compatibility between an alkoxysilane and an organic polymer is generally poor. Therefore, when the compatibility between the silicon compound used and the organic material used is poor, it is preferred to use a solvent capable of dissolving therein both of them. On the other hand, as specific examples of combinations of the silicon compound and the organic material which do not require the use of a solvent, there can be mentioned a combination of a polyethylene glycol (number average molecular weight: 400 to 1,000), which is in the liquid state, and tetraethoxysilane, and a combination of N,N-dimethylacrylamide (monomer), which is in the liquid state, and tetraethoxysilane. In each of the above-mentioned combinations, the uniform liquid mixture of the silicon compound and the organic material can be obtained without the use of a solvent.

With respect to the above-mentioned solvent, there is no particular limitation, as long as it is possible to obtain a solution having dissolved therein both the silicon compound and the organic material. Specifically, for example, when an alkoxysilane is used as the silicon compound, it is possible to use a solvent which is not capable of dissolving therein the alkoxysilane as such, but is capable of dissolving therein a mixture of the alkoxysilane and a hydrolysis product thereof, which is obtained by subjecting the alkoxysilane to partial hydrolysis. For example, when tetraethoxysilane is added to a mixed solvent of DMF (N,N-dimethylformamide) and ethanol, the tetraethoxysilane is not dissolved in the mixed solvent, and the resultant mixture separates into two layers. However, when a small amount of diluted hydrochloric acid is added to the obtained mixture and then, the resultant mixture is vigorously stirred to thereby subjecting the tetraethoxysilane to partial hydrolysis, a homogeneous solution is obtained in 2 to 3 minutes after the start of the partial hydrolysis. Therefore, in the present invention, it is possible to use a combination of the alkoxysilane, the organic polymer and the solvent, which can be used for obtaining the solution in the above-mentioned manner.

Preferred examples of solvents include alcohols, such as a $C_1$–$C_4$ monohydric alcohol, a $C_1$–$C_4$ dihydric alcohol and glycerol; amides, such as formamide, N-methylformamide, N-ethylformamide, N,N-dimethylformamide, N,N-diethylformamide, N-methylacetamide, N-ethylacetamide, N,N-dimethylacetamide, N,N-diethylacetamide, N-methylpyrrolidone, N-formylmorpholine, N-acetylmorpholine, N-formylpiperidine, N-acetylpiperidine, N-formylpyrrolidine, N-acetylpyrrolidine, N,N'-diformylpiperazine and N,N'-diacetylpiperazine; urea and derivatives thereof, such as tetramethylurea and N,N'-dimethylimidazolidinone; ethers, such as tetrahydrofuran, diethyl ether, di(npropyl) ether, diisopropyl ether, diglyme, 1,4-dioxane, ethylene glycol monomethyl ether, ethylene glycol dimethyl ether, ethylene glycol diethyl ether, propylene glycol monomethyl ether and propylene glycol dimethyl ether; esters, such as ethyl formate, methyl acetate, ethyl acetate, ethyl lactate, ethylene glycol monomethyl ether acetate, ethylene glycol diacetate, propylene glycol monomethyl ether acetate, diethyl carbonate, ethylene carbonate and propylene carbonate; ketones, such as acetone, methyl ethyl ketone, methyl propyl ketone, methyl n-butyl ketone, methyl isobutyl ketone, methyl amyl ketone, cyclopentanone and cyclohexanone; nitriles, such as acetonitrile, propiononitrile, n-butyronitrile and isobutyronitrile; and dimethyl sulfoxide, dimethyl sulfone, and sulfolane. These solvents can be used individually or in combination. Further, each of the above solvents can be mixed with a solvent other than mentioned above, or an additive, such as a leveling agent (which is used for improving the uniformity in the thickness of a coating), an adhesion promoter, a polymerization initiator, an acid generator, an alkali generator or an oxidizing agent.

Among the solvents mentioned above, especially preferred are amides, such as formamide, N-methylformamide, N-ethylformamide, N,N-dimethylformamide, N,N-diethylformamide, N-methylacetamide, N-ethylacetamide, N,N-dimethylacetamide, N,N-diethylacetamide, N-methylpyrrolidone, N-formylmorpholine, N-acetylmorpholine, N-formylpiperidine, N-acetylpiperidine, N-formylpyrrolidine, N-acetylpyrrolidine, N,N'-diformylpiperazine and N,N'-diacetylpiperazine; and urea and derivatives thereof, such as tetramethylurea and N,N'-dimethylimidazolidinone. These solvents can be advantageously used for obtaining a transparent and uniform silicon oxide-organic polymer composite thin film and a porous silicon oxide thin film having small-size pores.

In the method of the present invention, the hydrolysis and dehydration condensation of the silicon compound for forming the silicon oxide-organic polymer composite thin film need not be conducted in the presence of a catalyst. However, a catalyst may be used for prompting the hydrolysis and dehydration condensation of the silicon compound. Specific examples of catalysts for the hydrolysis and dehydration condensation of the silicon compound include acids, such as hydrochloric acid, nitric acid, sulfuric acid, formic acid, acetic acid, oxalic acid and maleic acid; alkali compounds, such as aqueous ammonia, potassium hydroxide, sodium hydroxide, triethylamine, triethanolamine, pyridine, piperidine and choline. These compounds can be used individually or in combination. Further, two or more of these compounds can be used in a stepwise manner. The term "stepwise manner" herein is intended to mean that, for example, the silicon compound/organic material mixture coated on the substrate is treated with an acid catalyst, followed by the addition of an alkali catalyst, and vice versa.

The amount of the catalyst for the hydrolysis and dehydration condensation of the silicon compound is generally 1 mol or less, preferably $10^{-1}$ mol or less, per mol of the silicon compound. When the amount of the catalyst exceeds 1 mol, a disadvantage is likely to be caused that the precipitation or the like occurs and hence, a uniform porous silicon oxide thin film cannot be obtained.

The hydrolysis of the alkoxysilane in the thin film of the silicon compound/organic material mixture can be effected as follows. When the above-mentioned catalyst is used in the form of an aqueous solution thereof, the hydrolysis can be effected by utilizing the water used as a solvent for the catalyst. Further, even if water is not added to the silicon compound/organic material mixture, the moisture present in the air can be utilized for effecting the hydrolysis if the amount of the moisture present in the air is sufficient for effecting the hydrolysis. In such a case, if desired, water may be further added to the silicon compound/organic material mixture. The amount of water to be added is preferably 0.3 to $10^4$ mol, more preferably 1 to 10 mol, per mol of the silicon atom contained in the alkoxysilane. When the amount is more than $10^4$ mol, the uniformity of the silicon oxide-organic polymer composite thin film is likely to be lowered.

With respect to the method for forming the thin film of the silicon compound/organic material mixture by applying onto a substrate the silicon compound/organic material mixture which is in the form of a liquid or a solution, a conventional method, such as a flow casting method, a revolution method and an immersion method, can be employed. The surface of the substrate may be preliminarily treated with an adhesion promoter. As the adhesion promoter, the so-called silane-coupling agent, an aluminum chelate compound and the like can be used. Examples of especially preferred adhesion promoters include 3-aminopropyltrimethoxysilane, 3-aminopropyltriethoxysilane, N-2-(aminoethyl)-3-aminopropyltrimethoxysilane, N-(2-aminoethyl)-3-aminopropylmethyldimethoxysilane, vinyltrichlorosilane, vinyltriethoxysilane, 3-chloropropyltrimethoxysilane, 3-chloropropylmethyldichlorosilane, 3-chloropropylmethyldimethoxysilane, 3-chloropropyldiethoxysilane, 3-mercaptopropyltrimethoxysilane, 3-glycidoxypropyltrimethoxysilane, 3-glycidoxypropylmethyldimethoxysilane, 3-methcryloxypropyltrimethoxysilane, 3-methacryloxypropylmethyldimethoxysilane, hexamethyldisilazane, ethylacetoacetatealuminumdiisopropyrate, aluminum-tris(ethylacetoacetate), aluminum-bis(ethylacetoacetate)monoacetylacetonate and aluminum-tris(acetylacetonate). If desired, these adhesion promoters may be used in combination with other additives, such as water, an acid and an alkali, or may be diluted with a solvent. The treatment with the adhesion promoter can be effected by a known method, for example, by a method described in a catalogue of a commercially available silane-coupling agent and the like.

With respect to the temperature for the gelation of the silicon compound, there is no particular limitation. The temperature is generally within the range of from 0 to 18° C., preferably from 30 to 150° C. When the temperature is too low, the rate of gelation is likely to become too low, so that it takes a long time to crosslink the silicon compound to a satisfactory level. On the other hand, when the temperature is too high, voids tend to be formed in the silicon oxideorganic polymer composite thin film, so that the uniformity of the obtained porous silicon oxide thin film is lowered.

The gelation time varies depending on the gelation temperature, the amount of a catalyst used for the gelation and the like. The gelation time is generally within the range of from several minutes to several days.

When the organic polymer having a polymerizable functional group, the polymerizable organic monomer or the mixture thereof is used, the polymerization thereof can be promoted by heating. The temperature for heating can be selected within the range of from 20 to 200° C. depending on the type of the polymerizable functional group contained in the organic polymer and the organic monomer. When the polymerizable functional group contained in the organic polymer used or the polymerizable organic monomer used is photopolymerizable, the polymerization reaction can be effected by light irradiation. When a polymerization initiator is used, the polymerization can be promoted by a known method, such as heating and light irradiation, depending on the type of the initiator. When the organic polymer having a photopolymerizable functional group and/or the photopolymerizable organic monomer, and the photopolymerization initiator are used, it is possible to effect the polymerization at only a desired portion of the thin film of the silicon compound/organic material mixture by light irradiation through a mask having a desired shape.

In the method of the present invention, when the organic polymer having a polymerizable functional group and/or the polymerizable monomer is used as the organic material, the hydrolysis and dehydration condensation of the silicon compound can be performed before, simultaneously with, or after the polymerization reaction of the organic polymer and/or the organic monomer, depending on the type and amount of the polymerization catalyst used and the polymerization initiator used, and the reaction conditions.

In the method of the present invention, when the silicon oxide-organic polymer composite thin film is formed by effecting the gelation of the silicon compound and the polymerization reaction of the organic polymer having a polymerizable functional group, the polymerizable organic monomer or the mixture thereof using a solvent in a closed system, the obtained silicon oxide-organic polymer composite thin film contains the solvent used. Therefore, the solvent is subsequently removed by drying. The drying temperature varies depending on the type of the solvent. However, the drying temperature is generally in the range of from 30 to 250° C. When the evaporation of a solvent is slow and the remaining solvent may cause a problem, such as lowering of the strength of the composite thin film, and contamination of the apparatus used in the subsequent step, it is also preferred to effect the drying under reduced pressure for completely removing the solvent by volatilization. Further, from the view-point of obtaining a uniform composite thin film by suppressing the occurrence of the formation of voids in the composite thin film, it is also preferred to gradually elevate the drying temperature.

On the other hand, when the formation of the silicon oxide-organic polymer composite thin film is conducted using a solvent in an open system, the evaporation of the solvent occurs simultaneously with the gelation of the silicon compound and the polymerization reaction of the organic polymer having a polymerizable functional group, the polymerizable organic monomer or the mixture thereof. The timing of the evaporation of the solvent can be controlled by selecting the types of the silicon compound, the polymerizable functional group contained in the organic polymer, the amount of the solvent, the vapor pressure of the solvent, the atmosphere and the like. However, under conditions generally employed, the solvent is substantially completely removed (evaporated) at the completion of the gelation of the silicon compound and the polymerization reaction of the organic polymer and/or the organic monomer.

The thus obtained preliminary insulator layer comprising a silicon oxide-organic polymer composite thin film comprises a silicon oxide having dispersed therein an organic polymer.

In the obtained preliminary insulator layer, as described below in detail, a groove which defines a desired pattern for a circuit is formed and then, a metal layer which functions as a circuit is formed in the groove. Then, the organic polymer is removed from the silicon oxide-organic polymer composite thin film of the preliminary insulator layer by the below-described heat treatment and the like to render the preliminary insulator layer porous, thereby converting the preliminary insulator layer to an insulator layer comprising a porous silicon oxide thin film. Thus, the circuit structure comprising a substrate having formed thereon an insulator layer is obtained.

With respect to the method for forming a groove (which defines a desired pattern for a circuit) in the preliminary insulator layer, it is especially preferred to employ a microprocessing method using a conventional lithography. Hereinbelow, an explanation is made with respect to the method of the present invention using a conventional lithography, referring to FIGS. 1 to 7.

Figure 2:
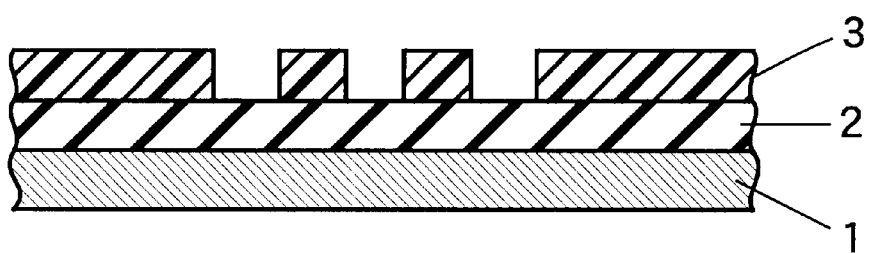
FIG. 2 is a cross-sectional view of a structure having a photoresist pattern corresponding to the desired pattern of a circuit, which is obtained by exposing and developing the photoresist film of the structure of FIG. 1.
Figure 3:
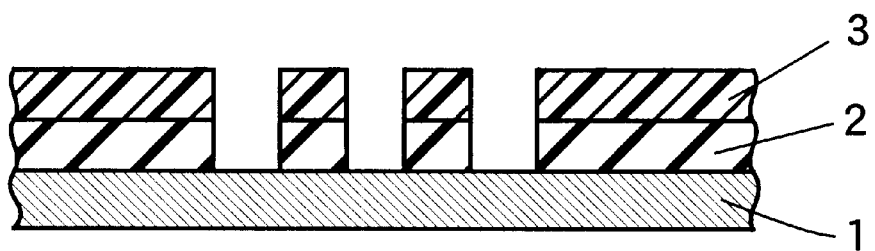
FIG. 3 is a cross-sectional view of a structure having a groove defining a pattern for a circuit, which is obtained by etching the silicon oxide-organic polymer composite thin film of the structure of FIG. 2 in accordance with the above-mentioned photoresist pattern.
Figure 4:
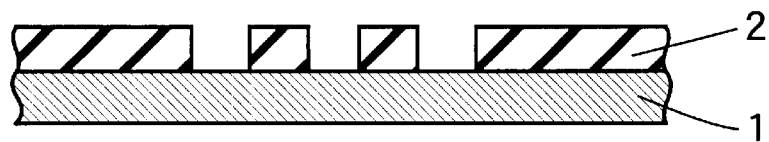
FIG. 4 is a cross-sectional view of a structure obtained by removing the photoresist from the structure of FIG. 3.

First, a photoresist is applied onto preliminary insulator layer 2 comprising a silicon oxide-organic polymer composite thin film which is formed on substrate 1, thereby obtaining a structure as shown in FIG. 1, which has photoresist layer 3 formed on the preliminary insulator layer. The obtained photoresist layer 3 is exposed to light through a mask having a desired pattern to thereby form a latent image on the photoresist layer, followed by development, thereby forming on preliminary insulator layer 2 the photoresist image of the desired pattern (see FIG. 2). With respect to the type of the photoresist, the method for the light exposure and the method for the development, there is no particular limitation, and the conventional photoresist and the conventional method can be employed. As an example of a commercially available photoresist which can be used in the present invention, there can be mentioned photoresists manufactured and sold by Tokyo Ohka Kogyo Co., Ltd., Japan under the trade name "TDUR". Examples of lights used for the light exposure include KrF excimer laser, g-line and i-line of a mercury lamp, ArF excimer laser and the like. As an example of a developer used in the development, there can be mentioned an aqueous solution of tetramethylammonium hydroxide. Subsequently, as shown in FIG. 3, a portion of preliminary insulator layer 2 (comprising a silicon oxide-organic polymer composite thin film) which is not protected by the photoresist layer is removed by etching, thereby forming a groove defining a pattern for a circuit on preliminary insulator layer 2. Examples of methods for etching include a plasma etching, a reactive ion etching, a down flow etching and a sputter etching. When the developer used for the development conducted after the light exposure for the pattern formation can dissolve preliminary insulator layer 2, the etching mentioned above can be effected by washing with the developer. Then, the photoresist is removed by washing with a solvent (a photoresist remover), plasma irradiation and the like to obtain a structure as shown in FIG. 4.

Figure 5:
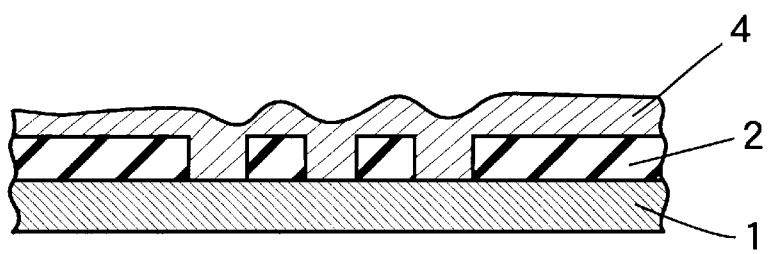
FIG. 5 is a cross-sectional view of a structure obtained by forming a metal layer on the surface of the structure of FIG. 4.

Then, as shown in FIG. 5, metal 4 functioning as a circuit is deposited in the groove and on the surface of preliminary insulator layer 2. Preferred examples of metals include aluminum, copper, silver, tungsten and titanium. These metals can be used individually or in combination. Prior to the deposition of the metal, a barrier layer may be formed on the surface of preliminary insulator layer 2 and the side walls and bottom wall of the groove, so that metal 4 is deposited in the groove and on the surface of the preliminary insulator layer through the barrier layer. Examples of materials for forming the barrier layer include an electrically conductive material, such as titanium nitride, and an electrically insulating material, such as a silicon nitride or a silicon oxide.

Each of the deposition of metal 4 and the formation of the barrier layer can be conducted by a conventional method, such as a physical deposition method (e.g., the sputtering) or an electrical deposition method (e.g., the CVD (chemical vapor deposition), the electroplating or the electroless plating). As another example of methods for the deposition of metal 4, there can be mentioned a method in which a solution of a metal-organic material composite (metalloorganics) (in which a metal and an organic material are chemically bonded to each other), followed by calcination. As an example of such a solution of the metal-organic material composite, there can be mentioned "Metalloorganics" manufactured and sold by Tanaka Kikinzoku Kogyo K.K., Japan.

Figure 6:
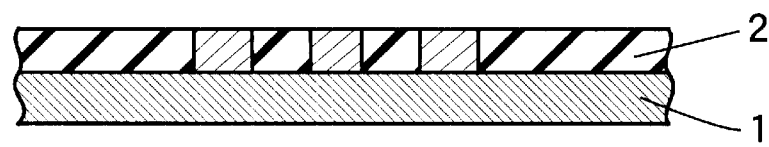
FIG. 6 is a cross-sectional view of a circuit structure obtained by removing the metal which is not present in the groove of the structure of FIG. 5, or obtained by forming a metal layer only in the groove of the structure of FIG. 4 by selective plating method.

Then, as shown in FIG. 6, the excess of the deposited metal 4 (i.e., the metal deposited on the portion other than the groove) is removed. As a preferred method for removing the excess of the deposited metal 4, there can be mentioned an etch back method using plasma and the like, and a chemical mechanical polishing (CMP) method. The CMP method is especially preferred.

Further, when the selective plating method is used for depositing metal 4 in the groove of preliminary insulator layer 2, it is possible to deposit metal 4 selectively in the groove of preliminary insulator layer 2. Therefore, in this case, the structure as shown in FIG. 6 can be prepared directly from the structure as shown in FIG. 4, i.e., it is not necessary form a structure as shown in FIG. 5 before the formation of the structure as shown in FIG. 6. With respect to the selective plating method, reference can be made to, for example, WO98/40910.

Figure 7:
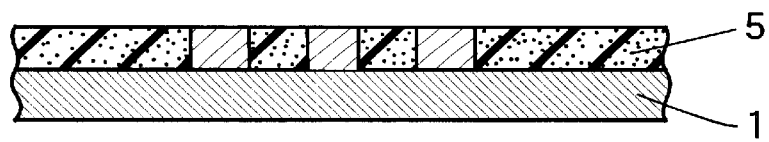
FIG. 7 is a cross-sectional view of a circuit structure having an insulator layer comprising a porous silicon oxide thin film, which is obtained by removing the organic polymer from the silicon oxide-organic polymer composite thin film of the structure of FIG. 6.

Then, from the silicon oxide-organic polymer composite posite thin film of preliminary insulator layer 2, the organic polymer is removed to thereby obtain the circuit structure of the present invention having a structure as shown in FIG. 7, which comprises a substrate 1, insulator layer 5 (formed on substrate 1) comprising a porous silicon oxide thin film having a groove, and a circuit comprising a metal layer formed in the groove. Examples of methods for removing the organic polymer include a solvent extraction and a plasma treatment. Further, as the simplest method, there can be mentioned a method in which the silicon oxide-organic polymer composite thin film is heated at a temperature equal to or higher than the decomposition temperature of the organic polymer contained in the composite thin film for 1 minute to several days, thereby decomposing the organic polymer. Needless to say, the temperature for decomposing the organic polymer should be selected, taking into consideration the types of the metal used and the organic material used. Generally, the temperature for decomposing the organic polymer is equal to or higher than the decomposition temperature of the organic polymer used, and is lower than the temperature at which the metal layer (functioning as a circuit) is melted. From the viewpoint of preventing the damage to an element or a circuit, which has been already formed on the substrate, the temperature for decomposing the organic polymer is preferably within the range of from 100 to 450° C., more preferably from 150 to 400° C. From this viewpoint, it is preferred that the heat treatment is conducted by light irradiation. In this case, it is especially preferred to use a light having such wavelengths that the preliminary insulator layer (comprising a silicon oxide-organic polymer composite thin film) can absorb the light.

When the polymer having a polymerizable functional group is used as the organic material and a photopolymerization initiator is used for promoting the polymerization of the polymer, the method of the present invention can be carried out without using a photoresist. Specifically, in this case, a structure as shown in FIG. 4, which has a preliminary insulator layer having a groove defining a desired pattern, can be obtained by a method comprising applying onto a substrate a raw material mixture containing a silicon compound, an organic polymer having a polymerizable functional group and a photopolymerization initiator, thereby forming a preliminary insulator layer on the substrate; exposing the preliminary insulator layer to light through a mask having a desired pattern, thereby polymerizing the polymer at the exposed portions of the preliminary insulator layer; and subjecting the resultant preliminary insulator layer to development (i.e., removal of the polymer at the unexposed portions of the insulator layer). The subsequent steps can be conducted in substantially the same manner as mentioned above.

In the present invention, it is preferred to treat the obtained porous silicon oxide thin film with a silylation agent for suppressing the water absorption of the thin film and improving the adhesion of the thin film to other substances. Examples of silylation agents usable in the present invention include alkoxysilanes, such as trimethylmethoxysilane, trimethylethoxysilane, dimethyldimethoxysilane, dimethyldiethoxysilane, methyltrimethoxysilane, methyltriethoxysilane, dimethylethoxysilane, methyldiethoxysilane, dimethylvinylmethoxysilane, dimethylvinylethoxysilane, diphenyldimethoxysilane, diphenyldiethoxysilane, phenyltrimethoxysilane and phenyltriethoxysilane; chlorosilanes, such as trimethylchlorosilane, dimethyldichlorosilane, methyltrichlorosilane, methyldichlorosilane, dimethylchlorosilane, dimethylvinylchlorosilane, methylvinyldichlorosilane, methylchlorodisilane, triphenylchlorosilane, methyldiphenylchlorosilane and diphenyldichlorosilane; and silazanes, such as hexamethyldisilazane, N,N'-bis(trimethylsilyl)urea, N-trimethylsilylacetamide, dimethyltrimethylsilylamine, diethyltriethylsilylamine and trimethylsilylimidazole. The treatment with the silylation agent can be conducted by a known method, such as coating, immersion and vapor exposure.

According to the method of the present invention, a circuit structure having an insulator layer comprising a porous silicon oxide having a low dielectric constant can be very easily produced by the damascene process which is advantageous not only in that a low resistance metal, such as copper or silver, can be used as a material for a circuit, but also in that this process is suitable for producing a multilayer circuit structure. Furthermore, the method of the present invention is free from a problem, such as the damage to the insulator layer (comprising a porous silicon oxide thin film) and the entrapment of an etching gas, metal particles and the like in the pores of the insulator layer. By the method of the present invention, not only can the line-to-line capacitance in the circuit structure be lowered, but also a low resistance metal, such as copper or silver, can be used as a material for a circuit, so that it has become possible to produce an excellent circuit structure in which the interconnect delay is greatly suppressed, as compared to the case of the conventional circuit structures.

The circuit structure obtained by the method of the present invention can be very advantageously used for producing a multi-layer circuit board and a semi-conductor device.

BEST MODE FOR CARRYING OUT THE INVENTION

Hereinbelow, the present invention will be described in more detail with reference to the following Examples and Comparative Examples, but they should not be construed as limiting the scope of the present invention.

EXAMPLE 1

0.74 g of methyltriethoxysilane, 2.4 g of tetraethoxysilane, 0.68 g of polyethylene glycol monomethacrylate having a number average molecular weight of 360 and 0.34 g of polyethylene glycol dimethacrylate having a number average molecular weight of 540 were dissolved in a mixed solvent of 2.0 g of N-methylpyrrolidone and 1.0 g of propylene glycol methyl ether acetate. To the resultant solution were added 0.75 g of water and 0.15 g of 0.1 N nitric acid, followed by stirring at room temperature for 2 hours. Subsequently, 0.05 g of dicumyl peroxide was added to the solution. The resultant solution was coated onto a silicon wafer having on its surface a thermal oxidation product film (an $SiO_2$ film) having a thickness of 1.2 µm using a spin coater (trade name: 1H-360S Spin Coater, manufactured and sold by Mikasa Co., Ltd., Japan) under conditions wherein the revolution rate of the silicon wafer was 1,500 rpm and the coating time was 10 seconds. The resultant coating was heated in the air at 120° C. for one hour and, then, at 180° C. for one hour, thereby obtaining a preliminary insulator layer comprising a silicon oxide-organic polymer composite thin film.

Then, a photoresist (trade name: THMR-iP3650, manufactured and sold by Tokyo Ohka Kogyo Co., Ltd., Japan) was applied onto the obtained preliminary insulator layer to obtain a laminate structure as shown in FIG. 1 which has a photoresist layer having a thickness of 1.05 µm. A test pattern image was transferred to the photoresist layer by means of a light exposure apparatus (trade name: i-line stepper FPA300i4, manufactured and sold by CANON INC., Japan). The resultant photoresist layer was developed using a 2.38% aqueous solution of tetramethylammonium hydroxide to remove portions of the photoresist layer which had been exposed, thereby obtaining a structure as shown in FIG. 2 which has, on the surface of the preliminary insulator layer, a photoresist image corresponding to the test pattern image. The configuration of the test pattern will be explained below.

The preliminary insulator layer (comprising the silicon oxide-organic polymer composite thin film) having the obtained photoresist image was subjected to etching through the photoresist image as a mask (i.e., a protective layer), using a reactive ion etcher (trade name: DEA506, manufactured and sold by Anelva Corporation, Japan), thereby removing portions of the silicon oxide-organic polymer composite thin film which were not protected by the mask to obtain a structure as shown in FIG. 3. The obtained structure had a positive pattern inversely corresponding to the test pattern, which is defined by grooves formed in the silicon oxide-organic polymer composite thin film. The etching was conducted under conditions wherein the total pressure in the etcher was adjusted to 30 Pa by using, as an etching gas, a gaseous mixture of 100 SCCM ("SCCM" is an abbreviation for "standard cubic centimeter per minute" which means a flow rate of a gas, as measured in terms of the volume of the gas flowed per minute under standard conditions (0° C., 1 atm)) of carbon tetrafluoride and 10 SCCM of oxygen, the electrical power was 300 W, and the etching time was 20 minutes.

Then, the photoresist was completely removed by oxidation using an asher (trade name MPC600, manufactured and sold by Mori Engineering Co., Ltd., Japan) under conditions wherein the oxygen pressure was 50 Pa, the temperature was 50° C., the electrical power was 150 W, and the oxidation time was 15 minutes, thereby obtaining a structure as shown in FIG. 4.

On the surface of the obtained structure having a positive pattern inversely corresponding to the test pattern, a titanium nitride film having a thickness of 30 nm was formed using a sputtering apparatus (trade name: SPF313H, manufactured and sold by Anelva Corporation, Japan), and then, a copper film having a thickness of 50 nm was formed on the titanium nitride film using the above-mentioned sputtering apparatus. Specifically, the above-mentioned titanium nitride film was formed by reactive sputtering using a titanium target and a gaseous mixture of argon and nitrogen (total pressure=0.27 Pa, partial pressure ratio=50:50), and the above-mentioned copper film was formed using a copper target and argon (total pressure=0.27 Pa). In the formation of both films, the electrical power used was 400 W. The titanium target and the copper target comprise copper plates respectively having soldered thereon a rolled titanium sheet and a rolled copper sheet, each having a desired shape. With respect to the sputtering, it is generally known that, during the sputtering, the ionized gas (such as argon gas) is forced to collide with the target to thereby expel the metal atoms or clusters thereof (i.e., titanium or copper atoms, or clusters thereof) from the surface of the target, and the expelled metal atoms or clusters thereof are deposited onto a substrate (such as a silicon wafer).

Then, the surface of the thus formed copper film was electroplated with copper using copper sulfate and an aqueous solution of sulfuric acid, to thereby obtain a structure as shown in FIG. 5 which has a copper layer having a thickness of 1.2 µm. With respect to the obtained structure, the grooves defining the positive pattern inversely corresponding to the test pattern (which were formed in the silicon oxide-organic polymer composite thin film) were completely filled with copper, and portions other than the grooves were also covered with a copper layer having a thickness of about 1.2 µm. The surface of the structure having the copper layer was polished with a slurry comprising aluminum oxide and hydrogen peroxide by means of a chemical mechanical polishing apparatus (trade name: 500STZ-6, manufactured and sold by NANOTECH MACHINES CO., LTD., Japan) to thereby completely remove the extra copper deposited on the portions other than the grooves. The resultant had a structure as shown in FIG. 6 which has copper layers in such a form as embedded in the silicon oxide-organic polymer composite thin film. The polishing was conducted under conditions wherein the polishing pressure was 4 Psi, the revolution rate of the wafer was 30 rpm, and the polishing time was 60 seconds.

Finally, the thus obtained structure was subjected to heat treatment at 400° C. in a nitrogen atmosphere for one hour to thereby burn off only the organic polymer in the preliminary insulator layer made of a silicon oxide-organic polymer composite thin film, thereby obtaining a circuit structure as shown in FIG. 7 which has an insulator layer comprising a porous silicon oxide thin film.

The positive pattern inversely corresponding to the above-mentioned test pattern comprises two parallel grooves each having a width of 0.5 µm, wherein the distance between the two grooves is 0.3 µm. In the obtained circuit structure, the metal layers formed in grooves formed a metallic circuit, and the insulator layer was present between the metal layers. Each of the metal layers (i.e., circuit lines) had an electrode pad portion at a terminal thereof. To the obtained circuit structure was applied an alternating voltage through the electrode pad portions of the metal layers, and the capacitance of the metal layers and the insulator layer positioned therebetween (which can be regarded as the capacitance of a parallel plate capacitor composed of the metals layers and the insulator layer positioned therebetween) was measured as the line-to-line capacitance.

Specifically, with respect to the obtained circuit structure, the line-to-line capacitance was measured by means of a RF impedance/material analyzer (trade name: HP4291A, manufactured and sold by Hewlett Packard Company, U.S.A.). As a result, it was found that the line-to-line capacitance was 0.101 pF/mm.

Comparative Example 1

A circuit structure was produced in substantially the same manner as in Example 1, except that the heat treatment (at 400° C. in a nitrogen atmosphere for one hour) for removing the organic polymer from the preliminary insulator layer was not carried out. In the obtained circuit structure, a preliminary insulator layer (comprising a silicon oxide-organic polymer composite thin film) as such was used as an insulator layer.

With respect to the obtained circuit structure, the line-to-line capacitance was measured. As a result, it was found that the line-to-line capacitance was 0.118 pF/mm. From the comparison between the results of Example 1 and the results of Comparative Example 1, it is apparent that, by the use of the porous silicon oxide thin film (obtained by removing the organic polymer from the silicon oxide-organic polymer composite thin film) as an insulator layer of a circuit structure, the line-to-line capacitance can be lowered, as compared to that in the case where the silicon oxide-organic polymer composite thin film as such is used as an insulator layer of a circuit structure.

Comparative Example 2

A preliminary insulator layer comprising a silicon oxide-organic polymer composite thin film was formed on a silicon wafer in substantially the same manner as in Example 1, except that the conditions for coating using a spin coater were changed, so that the thickness of the composite thin film became 0.7 μm instead of 0.8 μm. Then, the formed preliminary insulator layer was subjected to heat treatment for removing the organic polymer under the same conditions as in Example 1 (i.e., at 400° C. in a nitrogen atmosphere for one hour) to thereby burn off only the organic polymer in the silicon oxide-organic polymer composite thin film, thereby obtaining an insulator layer comprising a porous silicon oxide thin film. On the obtained insulator layer was formed a film of silicon dioxide having a thickness of 0.1 μm by chemical vapor deposition. Then, the formation of a positive pattern inversely corresponding to the test pattern (which is defined by grooves formed in the insulator layer), the formation of a copper layer and the removal of an extra copper (i.e., copper deposited on the portion other than the grooves) were conducted in substantially the same manner as in Example 1, thereby obtaining a circuit structure. During the production of the circuit structure, care was taken so as to form a positive pattern inversely corresponding to the test pattern, which has substantially the same configuration as that of the positive pattern in Example 1.

With respect to the obtained circuit structure, the line-to-line capacitance was measured. As a result, it was found that the line-to-line capacitance was 0.109 pF/mm. That is, despite that the porous silicon oxide thin film formed under substantially the same conditions as in Example 1 was used in Comparative Example 2, the line-to-line capacitance of the circuit structure obtained in Comparative Example 2 was disadvantageously high, as compared to that of the circuit structure obtained in Example 1. It is considered that such a disadvantageously high line-to-line capacitance of the circuit structure of Comparative Example 2 was caused due to the presence of the non-porous silicon dioxide film, which has a high dielectric constant, wherein the silicon dioxide film was used for protecting the porous silicon oxide thin film which was used as the insulator layer.

EXAMPLE 2

A circuit structure was produced in substantially the same manner as in Example 1, except that the removal of the organic polymer from the silicon oxideorganic polymer composite thin film was conducted by light irradiation at 380° C. in an argon atmosphere at 1 atm for 30 minutes using an infrared lamp, instead of heat treatment at 400° C. in a nitrogen atmosphere for one hour.

With respect to the obtained circuit structure, the line-to-line capacitance was measured. As a result, it was found that the line-to-line capacitance was 0.102 pF/mm. This value is almost the same as that (0.101 pF/mm) in Example 1. This shows that, even when the removal of the organic polymer from the silicon oxide-organic polymer composite thin film is conducted by light radiation, it is possible to achieve substantially the same effect as in the case where the removal of the organic polymer was conducted by the general heat treatment as conducted in Example 1 (i.e., heat treatment at 400° C. for one hour).

Reference Example 1

0.74 g of methyltriethoxysilane, 2.4 g of tetraethoxysilane, 0.68 g of polyethylene glycol monomethacrylate having a number average molecular weight of 360 and 0.34 g of polyethylene glycol dimethacrylate having a number average molecular weight of 540 were dissolved in a mixed solvent of 2.0 g of N-methylpyrrolidone and 1.0 g of propylene glycol methyl ether acetate. To the resultant solution were added 0.75 g of water and 0.15 g of 0.1 N nitric acid, followed by stirring at room temperature for 2 hours. Subsequently, 0.05 g of dicumyl peroxide was added to the solution. The resultant solution was coated onto a silicon wafer having on its surface a titanium nitride thin film, using a spin coater (trade name: 1H-360S Spin Coater, manufactured and sold by Mikasa Co., Ltd., Japan) under conditions wherein the revolution rate of the silicon wafer was 1,500 rpm. The resultant coating was heated in the air at 120° C. for one hour and, then at 180° C. for one hour, thereby obtaining a silicon oxide-organic polymer composite thin film. (The above-mentioned titanium nitride thin film was formed by the reactive sputtering using a titanium target and a gaseous mixture of argon and nitrogen (total pressure=0.27 Pa, partial pressure ratio=50:50).) The obtained composite thin film was subjected to heat treatment at 400° C. in a nitrogen atmosphere for one hour to burn off only the organic polymer in the silicon oxide-organic polymer composite thin film, thereby obtaining a porous silicon oxide thin film. The thickness of the obtained porous silicon oxide thin film was 0.50 μm. Then, on the surface of the thus obtained porous silicon oxide thin film was vacuum-deposited aluminum through a mask, to thereby form, on the porous silicon oxide thin film, electrodes each having a diameter of 1.7 mm. Using the thus obtained structure, the dielectric constant of the porous silicon oxide thin film at 1 MHz was measured. As a result, it was found that the dielectric constant was 2.01.

Reference Example 2

1.2 g of tetraethoxysilane and 0.68 g of polyethylene glycol monomethacrylate having a number average molecular weight of 360 were dissolved in a mixed solvent of 2.0 g of N-methylpyrrolidone and 1.0 g of propylene glycol methyl acetate. To the resultant solution were added 0.75 g of water and 0.15 g of 0.1 N nitric acid, followed by stirring at room temperature for 2 hours. The resultant solution was coated onto a silicon wafer, using a spin coater (trade name: 1H-360S Spin Coater, manufactured and sold by Mikasa Co., Ltd., Japan) under conditions wherein the revolution rate was 1,500 rpm. The resultant coating was heated in the air at 120° C. for one hour and, then at 180° C. for one hour, thereby obtaining a sample structure comprising the silicon wafer having, formed thereon, a silicon oxide-organic polymer composite thin film having a thickness of 0.41 µm. The obtained sample structure was subjected to heat treatment at 450° C. in a nitrogen atmosphere for one hour to thereby burn off only the organic polymer in the silicon oxide-oraganic polymer composite thin film, thereby obtaining a porous silicon oxide thin film. The thickness of the obtained thin film was 0.32 µm. That is, the thickness decrease caused by the removal of the organic polymer (which is calculated by the formula: the thickness of the silicon oxide-organic polymer composite thin film–the thickness of the porous silicon oxide thin film)/the thickness of the silicon oxide-organic polymer composite thin film) was 22%.

Reference Example 3

Substantially the same procedure as in Reference Example 2 was repeated, except that a polyethylene glycol having a number average molecular weight of 20,000, which had no polymerizable functional group, was used instead of polyethylene glycol monomethacrylate, thereby obtaining a sample structure comprising the silicon wafer having, formed thereon, a silicon oxide-organic polymer composite thin film having a thickness of 1.451 µm. The obtained sample structure was subjected to heat treatment at 450° C. in a nitrogen atmosphere for one hour to thereby burn off only the organic polymer in the silicon oxide-organic polymer composite thin film, thereby obtaining a porous silicon oxide thin film. The thickness of the obtained thin film was 1.07 µm. That is, the thickness decrease caused by the removal of the organic polymer (which is calculated by the formula: (the thickness of the silicon oxideorganic polymer composite thin film–the thickness of the porous silicon oxide thin film)/the thickness of the silicon oxide-organic polymer composite thin film)) was 26%.

Industrial Applicability

By the method of the present invention which is based on the damascene process (this process is commercially advantageous not only in that a low resistance metal, such as copper or silver, can be used as a material for a circuit, but also in that this process is suitable for the production of a multilayer circuit board), not only can the line-to-line capacitance in the circuit structure be lowered, but also a low resistance metal, such as copper or silver, can be used as a material for a circuit, so that it has become possible to produce an excellent circuit structure in which the delay in the transmission of the electric signal (i.e., the interconnect delay) is greatly suppressed, as compared to the case of the conventional circuit structures. Further, by the method of the present invention, it has become possible to produce effectively, efficiently such an excellent circuit structure.

The multilayer circuit board and the semiconductor device, each comprising the above-mentioned excellent circuit structure produced by the method of the present invention, exhibit excellent performance, since the interconnect delay is greatly suppressed.

What is claimed is:

1. A method for producing a circuit structure comprising:
   (a) a substrate,
   (b) an insulator layer formed on said substrate, said insulator layer comprising a porous silicon oxide thin film having a groove, said groove defining a pattern for a circuit, and
   (c) a circuit comprising a metal layer formed in said groove, said method comprising the steps of:
   (1) forming a preliminary insulator layer comprising a silicon oxide-organic polymer composite thin film formed on said substrate, said silicon oxide-organic polymer composite thin film comprising a silicon oxide having an organic polymer dispersed therein,
   (2) forming, in said preliminary insulator layer, a groove which defines a pattern for a circuit,
   (3) forming, in said groove, a metal layer which functions as a circuit, and
   (4) removing said organic polymer from said silicon oxide-organic polymer composite thin film of said preliminary insulator layer to render said preliminary insulator layer porous, thereby converting said preliminary insulator layer to an insulator layer comprising a porous silicon oxide thin film.

2. The method according to claim 1, wherein the removal of said organic polymer from said preliminary insulator layer is conducted by light irradiation-heat treatment.

3. The method according to claim 2, wherein said organic polymer in said silicon oxide-organic polymer composite thin film comprises at least one polymer selected from the group consisting of a polymer having a graft structure and a polymer having a three-dimensional network structure.

4. The method according to claim 1, wherein said organic polymer in said silicon oxide-organic polymer composite thin film comprises at least one polymer selected from the group consisting of a polymer having a graft structure and a polymer having a three-dimensional network structure.

5. A circuit structure produced by the method of claim 1.

6. A multilayer circuit board comprising a laminate of a plurality of circuit structures, wherein at least one circuit structure of said circuit structures is the circuit structure of claim 3.

7. A semiconductor device comprising the circuit structure of claim 4.

* * * * *